(12) United States Patent
Pilz

(10) Patent No.: US 10,511,260 B2
(45) Date of Patent: Dec. 17, 2019

(54) CIRCUIT FOR SUPPLYING POWER TO AN ELECTRIC LOAD, AND FOR RECEIVING DESIRED SIGNALS SENT FROM THE ELECTRIC LOAD

(71) Applicant: Endress+Hauser Conducta GmbH+Co. KG, Gerlingen (DE)

(72) Inventor: Stefan Pilz, Geithain (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 151 days.

(21) Appl. No.: 15/792,035

(22) Filed: Oct. 24, 2017

(65) Prior Publication Data

US 2018/0115281 A1   Apr. 26, 2018

(30) Foreign Application Priority Data

Oct. 24, 2016   (DE) .................. 10 2016 120 254

(51) Int. Cl.
*H03D 1/18*   (2006.01)

(52) U.S. Cl.
CPC .................... *H03D 1/18* (2013.01)

(58) Field of Classification Search
CPC .......................................... H03D 1/18
USPC ........................................ 329/369; 307/104
See application file for complete search history.

(56) References Cited

U.S. PATENT DOCUMENTS

| | | | | |
|---|---|---|---|---|
| 9,407,332 B2 * | 8/2016 | Norconk | ............... | H04B 5/0031 |
| 2007/0228833 A1 * | 10/2007 | Stevens | ................... | H02J 5/005 |
| | | | | 307/45 |
| 2010/0270867 A1 * | 10/2010 | Abe | ........................ | H02J 7/025 |
| | | | | 307/104 |
| 2011/0309688 A1 * | 12/2011 | Yamazaki | ............... | H02J 7/025 |
| | | | | 307/104 |
| 2014/0203660 A1 * | 7/2014 | Adachi | ................ | H04B 5/0037 |
| | | | | 307/104 |
| 2015/0008876 A1 * | 1/2015 | Kwak | ..................... | H02J 50/10 |
| | | | | 320/108 |
| 2015/0054344 A1 * | 2/2015 | Ng | .......................... | H02J 5/005 |
| | | | | 307/104 |
| 2016/0285311 A1 * | 9/2016 | Masumoto | ............. | H02J 50/80 |
| 2016/0336785 A1 * | 11/2016 | Gao | ....................... | H02J 50/80 |
| 2016/0336816 A1 * | 11/2016 | Mach | ..................... | H02J 50/80 |
| 2017/0025895 A1 * | 1/2017 | Hayashida | .............. | H02J 7/025 |
| 2017/0279315 A1 * | 9/2017 | Sakata | .................... | H02J 50/80 |

* cited by examiner

*Primary Examiner* — Joseph Chang
(74) *Attorney, Agent, or Firm* — Mark A. Logan; PatServe

(57) ABSTRACT

Described is a circuit for supplying power to an electric load connected to the circuit via an interface, and for receiving desired signals transmitted from the electric load by an amplitude modulation, performed by the electric load, of a carrier signal transmitted from the circuit via the interface, said carrier signal serving to supply power to the electric load, with a carrier signal generator that comprises a direct voltage source and a DC-AC converter downstream of the direct voltage source, and with a demodulator for extraction of desired signals modulated by the electric load on the carrier signal, which circuit has a high efficiency without the use of choke coils. The demodulator is designed to extract the desired signals using a current corresponding to a carrier signal current flowing through a current path of the circuit during a transmission of the desired signals, said carrier signal current flowing across the interface.

16 Claims, 2 Drawing Sheets

CIRCUIT FOR SUPPLYING POWER TO AN ELECTRIC LOAD, AND FOR RECEIVING DESIRED SIGNALS SENT FROM THE ELECTRIC LOAD

CROSS-REFERENCE TO RELATED APPLICATION

The present application is related to and claims the priority benefit of German Patent Application No. 10 2016 120 254.1, filed on Oct. 24, 2016, the entire contents of which are incorporated herein by reference.

TECHNICAL FIELD

The invention relates to a circuit for supplying power to an electric load that can be connected to the circuit via an interface, and for receiving desired signals transmitted from the electric load by means of an amplitude modulation, performed by the electric load, of a carrier signal transmitted from the circuit via the interface, said carrier signal serving to supply power to the electric load, with a carrier signal generator that comprises a direct voltage source and a DC-AC converter downstream of the direct voltage source, and a demodulator for extraction of desired signals modulated by the electric load on the carrier signal.

BACKGROUND

Circuits of this type are used in field devices, for example. There, they may be used in a superordinate unit, e.g., a transmitter, that supplies an electric load, e.g., a sensor, with power via an interface that can be connected thereto, and receives desired signals transmitted from said electric load. Information about this, e.g., characteristic values of the sensor and/or measurement values determined by the sensor, may be transferred from the electric load to the superordinate unit.

For this, FIG. 1 shows a block diagram of a circuit 1 known from the prior art for supplying power to an electric load 5 that can be connected to the circuit 1 via an interface 3, and for receiving desired signals transmitted from the electric load by means of an amplitude modulation, performed by the electric load, of a carrier signal transmitted from the circuit 1 via the interface 3, said carrier signal serving to supply power to the electric load 5.

For a better understanding of the circuit 1, here, the circuit 1 is depicted together with the interface 3 connected thereto and the electric load 5 connected to the interface.

The interface 3 here is designed as an inductive interface 3 that enables a wireless transfer of power and desired signals. This comprises a circuit-side inductance L1, connected to the circuit 1, that forms a transmitter together with an electric load-side inductance L2 connected to the electric load 5.

For example, this interface 3 may be integrated into a plug connector via which a superordinate unit comprising the circuit 1 may simultaneously be connected to the electric load 5 mechanically, and also electrically. Plug connectors equipped with an inductive interface, as they are distributed by the applicant under the designation MEMOSENS, are an example of this. These plug connectors comprise two components that can be mechanically connected to one another, in which is respectively enclosed an inductance L1, L2 that forms an inductive transmitter, together with the inductance L2, L1 arranged in the respective other component connected thereto.

The circuit 1 comprises a carrier signal generator having a direct voltage source $U_{DC}$ and a DC-AC converter 7 downstream of the direct voltage source $U_{DC}$, at the output of which DC-AC converter 7 is provided a carrier signal having a carrier signal frequency set by the DC-AC converter 7.

The electric load 5 comprises an element 9 to be supplied with power via the interface 3 for example, the sensor S connected via a rectifier 11 to the two terminals of the electric load-side inductance L1.

Moreover, the electric load 3 comprises a modulator 13 for modulating the amplitude of the carrier signal transmitted via the interface 3. This comprises a load 15 connected parallel to the element 9 to be supplied, which load 15 is connected via a controllable switch (not designated in detail here) upstream of said load 15, at times predetermined by the digital desired signal to be transmitted from the electric load 5.

The connection of the load 15 produces a discontinuous voltage drop, the voltage dropping across the circuit-side inductance L1. Accordingly, a demodulator 17 connected in parallel to the circuit-side inductance L1 is used to extract the desired signal, at the inputs of which demodulator 17 is the voltage dropping across said circuit-side inductance L1. The demodulator 17 comprises a rectifier 19, a bandpass filter 21 downstream of the rectifier, and a comparator 23 with an adjustable comparator threshold downstream of the bandpass filter 21, at the output of which is provided an information signal reflecting the received desired signal.

However, this form of desired signal transfer requires that the voltage drop produced by the connection of the load 15 not fall below a minimum value that can be reliably detected via the demodulator 17 connected in parallel to the load 15.

The cause of the voltage drop is the electric load current flowing across the load upon connection of the load in parallel with the current flowing through element 9 to be supplied. With regard to this current flow, the DC-AC converter 7, the interface 3, and the load 15 form impedances connected in series. So that the electric load current flowing across the load 15 upon connection of said load 15 produces an optimally large voltage drop of the voltage dropping across the circuit-side inductance L1, the DC-AC converter 7 must have an optimally high impedance. For this reason, amplifiers with high impedance, e.g., the Class E amplifier shown in FIG. 1, are used as DC-AC converters 7 in the prior art. These amplifiers typically comprise resonators clocked via a switching step, upstream of which are connected in the series arm an ohmic resistor R and a choke coil LD connected thereto in series. Via a correspondingly high impedance of the series circuit of resistor R and choke coil LD, it is thereby ensured that a sufficiently large voltage drop is also produced via the connection of the load 15, when the element 9 of the electric load 5 to be supplied with power consumes a comparably large amount of power.

However, it is disadvantageous that a correspondingly high power loss is realized due to the resistive portion of this impedance in the amplifier. This power loss is not provided for supplying the electric load 5, and accordingly degrades the efficiency of the circuit 1.

An additional disadvantage is that choke coils LD are comparably large components that not only take up a large amount of space, but also are mechanically sensitive. The latter, especially, represents a problem when the circuit 1 is to be used in a housing that is subsequently filled with a potting compound. For example, such a potting compound is used in order to avoid a penetration of moisture into the housing. Damage to the choke coil LD installed on the circuit board may thereby already occur upon potting of the internal space. Moreover, a later thermal expansion of the cured potting compound may also lead to damage to the choke coil LD and/or to it making contact.

SUMMARY

It is an aim of the invention to specify a device of the aforementioned type that overcomes the aforementioned problems.

For this, the invention comprises a circuit for supplying power to an electric load that can be connected to the circuit via an interface, and for receiving desired signals transmitted from the electric load by means of an amplitude modulation, performed by the electric load, of a carrier signal transmitted from the circuit via the interface, said carrier signal serving to supply power to the electric load, with a carrier signal generator that comprises a direct voltage source and a DC-AC converter downstream of the direct voltage source, and a demodulator for extraction of desired signals modulated by the electric load on the carrier signal, characterized in that the demodulator is designed such that it extracts desired signals using a current corresponding to a carrier signal current flowing through a current path of the circuit during a transmission of the desired signals, said carrier signal current flowing across the interface.

A first development is characterized in that the demodulator comprises a sub-circuit used in a series branch of the circuit through which flows a current corresponding to the carrier signal current especially, a current measurement device measuring the current or a current detection circuit via which an output signal corresponding to the carrier signal current can be tapped.

An embodiment of the first development is characterized in that the sub-circuit especially, the current measurement device or the current detection circuit is arranged, between the direct voltage source and the DC-AC converter, in one of the two series branches of the circuit that connects the direct voltage source to the DC-AC converter.

A development of the first development is characterized in that an amplifier connected in parallel to the current path is downstream of the current detection circuit, a bandpass filter is downstream of the amplifier, and a comparator with adjustable comparator threshold is downstream of the bandpass filter.

A further development of the first development is characterized in that the DC-AC converter comprises a resonator fed via a switching device, and the current detection circuit, together with the switching device, forms an envelope demodulator.

A further development of the first development is characterized in that a bridge path parallel to the sub-circuit especially, connected to the series branch in parallel with the current detection device is provided, and a switch is used in the bridge path, which switch is activated by means of a control device such that the switch interrupts the bridge path during the reception of desired signals.

A further development of the first development is characterized in that the current detection circuit comprises a resistor inserted into the series branch and a capacitor connected in parallel to this resistor, and the output signal of the current detection circuit is a voltage dropping across the capacitor, which voltage can be tapped via said capacitor.

A second development is characterized in that the DC-AC converter is formed by a resonator fed via a switching device especially, a switching device designed as a full bridge or a switching device designed as a half bridge wherein the DC-AC converter is especially designed and integrated into the circuit such that the circuit has components increasing the converter impedance, said components being neither contained in the DC-AC converter nor connected in series to the DC-AC converter.

A development of the second development is characterized in that the resonator is a resonant circuit operated via a timer of the switch of the switching device in the resonance range, said timer being matched to its resonance frequency, wherein the resonant circuit is, especially, an LLC resonant circuit, the resonant circuit especially comprises exclusively at least one capacitor and at least one coil, and/or the resonant circuit especially comprises at least one series resonant circuit and/or at least one parallel resonant circuit.

A third development is characterized in that the circuit is connected via an interface to an electric load that comprises a circuit-side inductance connected to the circuit and an electric load-side inductance connected to the electric load, forming a transmitter together with the circuit-side inductance, downstream of the demodulator is a circuit suitable for asynchronous, serial data transmission especially, a universal asynchronous receiver/transmitter especially, a universal asynchronous receiver/transmitter of a microcontroller or of an RS-485 driver especially, a circuit connected to a data processing device and/or the electric load is a modulator especially, a load modulator having a load that can be connected in parallel to an element of the electric load that is to be supplied with power, said parallel connection being via a switch controllable using the desired signals to be transmitted.

The invention additionally comprises a method for supplying power to a load that can be connected to a circuit via an interface, and for receiving desired signals that are transmitted from the load by means of an amplitude modulation, performed by the load, of a carrier signal transmitted from the circuit via the interface, said carrier signal serving to supply power to the load, in which the circuit generates the carrier signal by means of a direct voltage source and a DC-AC converter downstream of said direct voltage source, and supplies the carrier signal via the interface to the electric load that is thereby supplied with power, characterized in that desired signals transmitted from the electric load via the interface via amplitude modulation especially, via load modulation of the carrier signal are extracted using a current that corresponds to a carrier signal current flowing across the interface during the transmission.

A development of this method is characterized in that the DC-AC converter is formed by a resonator fed via a switching device, wherein the DC-AC converter is especially designed and integrated into the circuit such that the circuit has components increasing the converter impedance, said components being neither contained in the DC-AC converter nor connected in series to the DC-AC converter, and the current is detected by means of a current detection circuit inserted into a series branch of the circuit through which current corresponding to the carrier signal current flows especially, a current detection circuit inserted into the series branch between the direct voltage source and the DC-AC converter.

The invention additionally comprises a field device having a circuit according to the invention, characterized in that the field device comprises a superordinate unit comprising the circuit especially, a transmitter and an electric load that can be connected to the superordinate unit especially, an electric load comprising a sensor to be supplied with power by the superordinate unit and the electric load comprises a modulator especially, a load modulator by means of which the electric load transmits desired signals to the circuit via amplitude modulation of a carrier signal transmitted from the circuit via the interface during operation.

A preferred embodiment of this field device is characterized in that the interface is arranged in a plug connector via which the superordinate unit can be connected to the electric load, wherein the plug connector especially comprises two components that can be mechanically connected to one another especially, a plug and a socket in which is arranged a respective half of the interface especially, an inductance that, in the connected state, forms a transmitter together with an inductance arranged in the other component and/or of which one is connected directly or via a cable to the superordinate unit, and the other is connected directly or via a cable to the electric load.

The invention offers the advantage that the extraction of the desired signal also may reliably take place when only slight voltage drops in the voltage falling across the interface are produced via the amplitude modulation of the carrier signal. That offers the large advantage that the DC-AC conversion can be contained in the converter, or can be executed at impedance-increasing components connected in series to the converter. In circuits according to the invention, less power loss is thus realized than in circuits known from the prior art. They thus have a higher efficiency.

An additional advantage is that no choke coils are required. That offers the advantage that the circuit can be used without any problem in a housing filled with potting compound.

BRIEF DESCRIPTION OF THE DRAWINGS

The present disclosure and further advantages will now be explained in detail using the Figures of the drawing in which an exemplary embodiment is shown; identical elements in Figures are provided with the same reference characters.

DETAILED DESCRIPTION

Figure 2:
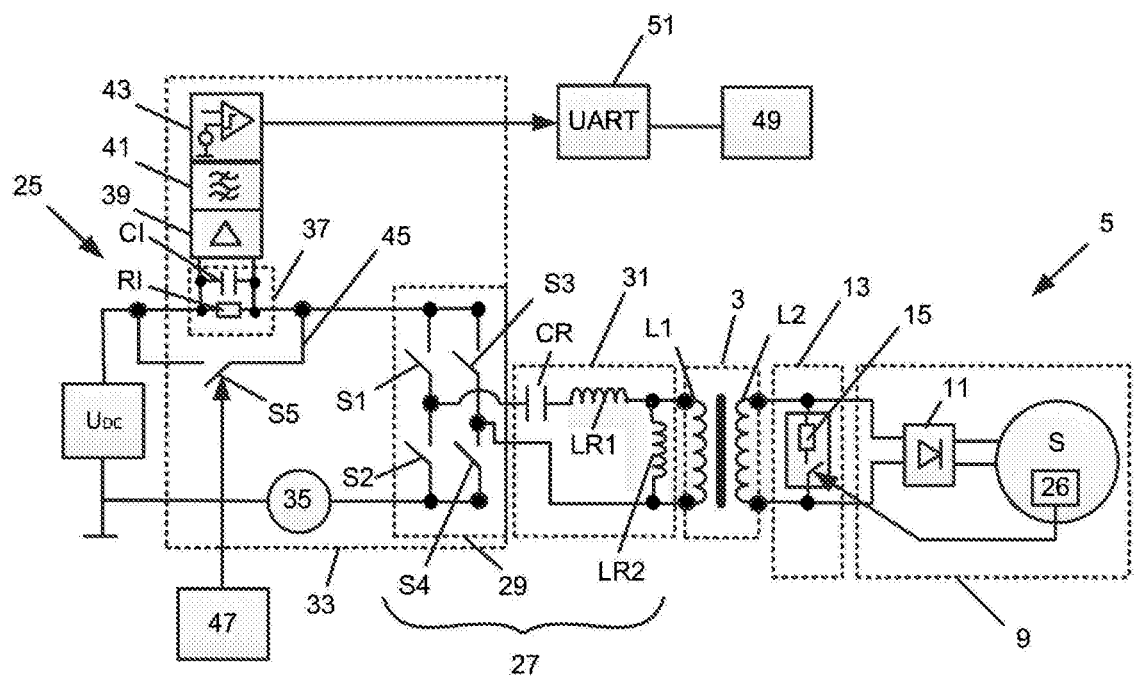
FIG. 2 shows a circuit according to the invention, together with an electric load connected thereto via an interface.

FIG. 2 shows a block diagram of a circuit 25 according to the invention for supplying power to an electric load 5 that can be connected to the circuit 25 via an interface 3, and for receiving desired signals that are transmitted from the electric load 5 by means of an amplitude modulation, performed by the electric load 5, of a carrier signal transmitted from the circuit 25 via the interface 3, said carrier signal serving to supply power to the electric load 5.

For better understanding, here, the circuit 25 is depicted together with the interface 3 connected thereto, and with the electric load 5 connected to the interface.

The interface 3 is preferably designed as an inductive interface 3 that comprises a circuit-side inductance L1 to be connected to the circuit 25, which circuit-side inductance L1 forms a transmitter together with an electric load-side inductance L2 to be connected to the electric load 5.

Furthermore, here, the electric load 5 also comprises: an element 9 to be supplied with power via the interface 3 for example, the sensor S fed via a rectifier 11, said sensor S here being connected in parallel to the interface 3, and thus here in parallel to the load-side inductance L2; and a modulator 13 for modulating the amplitude of the carrier signal transmitted via the interface 3. The amplitude modulation of the carrier signal preferably takes place via an amplitude keying known under the English designation, "Amplitude Shift Keying (ASK)," in which the amplitude of a preferably sinusoidal carrier signal is modulated according to a desired signal present in digital form. The amplitude modulation may also take place as a load modulation here. For this, the modulator 13 shown in FIG. 2 comprises a load 15 connected in parallel to the element 9 to be supplied and in parallel to the interface 3 here, thus parallel to the load-side inductance L2 which load 15 is upstream of a controllable switch (not designated in detail here) via which the load 15 can be connected at times predetermined by the digital desired signals to be transmitted from the electric load 5. The desired signal may, for example, thereby be generated by means of a data processing unit 26 a microcontroller, for example provided in the electric load 5, which data processing unit 26 supplies the information to be transmitted to a control input of the switch in the form of a digital control signal suitable for corresponding timing of the switch. This is illustrated by an arrow in FIG. 2.

Figure 1:
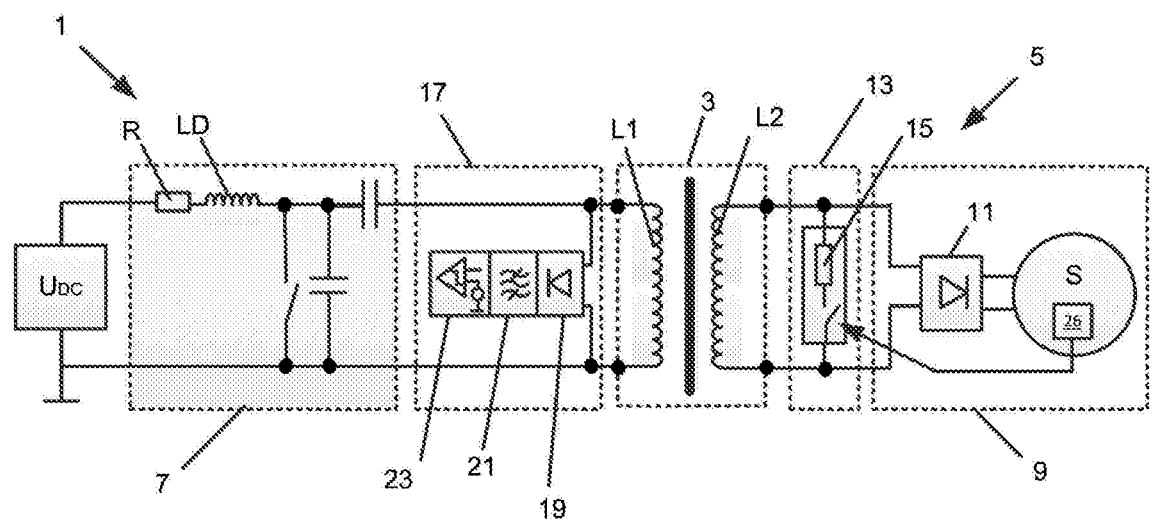
FIG. 1 shows a circuit known from the prior art, together with an electric load connected thereto via an interface.

Just like the circuit 1 shown in FIG. 1 and known from the prior art, the circuit 25 according to the present disclosure also comprises a carrier signal generator that comprises a direct voltage source $U_{DC}$ and a DC-AC converter 27 downstream of the direct voltage source $U_{DC}$. The DC-AC converter 27 that is presented here as an exemplary embodiment comprises a resonator 31 fed via a switching device 29.

The circuit 25 according to the present disclosure is characterized in that a demodulator 33 is used to extract the desired signal, which demodulator 33 is designed such that it extracts the desired signal, modulated on the carrier signal, using a current flowing through a current path of the circuit 1 during the transmission of the carrier signal via the interface 3, which current corresponds to the carrier signal current flowing across the interface 3. This current, corresponding to the carrier signal current, is a direct measure of the current consumption of the electric load 5 that is provided by the sum of the load current flowing across the load modulator 13 and of the supply current flowing across the element 9 to be supplied.

According to the present disclosure, such method that a carrier signal is generated by means of the direct voltage source $U_{DC}$ and the DC-AC converter 27, which carrier signal is supplied via the interface 3 to the electric load 5 that is hereby supplied with power. In the counter-direction, the electric load 5 transmits desired signals via the interface 3 by performing an amplitude modulation of the carrier signal that corresponds to the desired signal. According to the invention, this desired signal is then extracted using a current that corresponds to the carrier signal current flowing across the interface.

The present disclosure offers the advantage that the amplitude modulation performed on the load side also leads to reliably detectable increases in the carrier signal current when the voltage drop that is involved therewith said voltage drop being of the voltage falling across the interface 3 especially, the circuit-side inductance L1 is low.

That offers the large advantage that, in circuits 25 according to the invention, a DC-AC converter 27 with distinctly lower impedance may be used, instead of the amplifier with high impedance that is required for DC-AC conversion in the prior art. The DC-AC converter 27 is, accordingly, preferably designed and integrated into the circuit 25 such that the circuit 25 has components increasing the converter impedance, said components being neither contained in the DC-AC converter 27 nor connected in series to the DC-AC converter.

Especially suitable for this are DC-AC converters that comprise only the aforementioned resonator 31 fed via the switching device 29. Additional components increasing the converter impedance especially, high-resistance components such as series circuits comprising a resistor R and a choke coil LD and provided in the series branch are not necessary.

The switching device 29 is, thereby, preferably designed as a full bridge or as a half bridge, and the resonator 31 is preferably formed by a resonant circuit that is operated in a resonance range via a timing of the switch of the switching device 29 that is matched to its resonance frequency.

As one possible exemplary embodiment, for this, FIG. 2 shows a switching device 29, designed as a full bridge, that feeds the resonator 31. The full bridge comprises two switches S1, S2 connected in series in a first shunt arm of the circuit 25 that is downstream of the direct voltage circuit $U_{DC}$, and two switches S3, S4 connected in series in a second shunt arm connected in parallel to the first shunt arm Q1.

Figure 3:
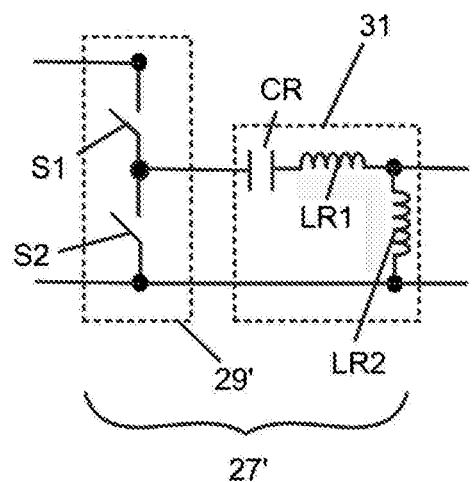
FIG. 3 shows an alternative embodiment of a DC-AC converter that can be used in the circuit of FIG. 2.

FIG. 3 shows a modification of the AC-DC converter 27' in which the resonator 31 depicted in FIG. 2 is fed via a half bridge that comprises only two switches S1, S2 connected in series in a shunt arm of the circuit 25 that is downstream of the direct voltage circuit $U_{DC}$.

Especially suitable as resonators 31 are resonator circuits that comprise exclusively at least one capacitor and at least one coil, and/or resonant circuits that comprise at least one series resonant circuit and/or at least one parallel resonant circuit.

Shown in FIG. 2 as an exemplary embodiment is an LLC resonant circuit that comprises a capacitor CR arranged in a series branch connected to a tap arranged between the two switches S1, S2 of the first shunt arm of the switching device 29, and an inductance LR1 connected in series to this. The series branch is connected via a shunt arm connected in parallel to the circuit-side inductance L1, in which shunt arm is arranged an additional inductance LR2 to a tap arranged between the two switches S3, S4 arranged in the second shunt arm. The additional inductance LR2 facilitates the dimensioning of the resonant circuit. However, it may be omitted if its function of co-determining the resonance frequency of the resonant circuit is also taken over by the circuit-side inductance L1 of the interface 3.

Alternatively, other resonant topologies may also be used instead of the LLC resonant circuit shown here as an example.

DC-AC converters 27, 27' that comprise resonators 31 fed via the switching device 29, 29' have an impedance whose resistive portion is distinctly smaller than the resistive portion of the impedances of Class E amplifiers used as DC-AC converters 7 in the aforementioned prior art. That offers the advantage that the power loss realized in these DC-AC converters 27, 27' is distinctly smaller than in the previously known circuits. Circuits 25 according to the invention thus have a distinctly higher efficiency.

However, that inevitably means that the voltage decrease of the voltage dropping across the circuit-side inductance L1, said decrease being due to the connection of the load 15, is distinctly lower than in the circuits 1 known from the prior art. This voltage drop might therefore normally be too small to produce a reliable extraction of the desired signal modulated on the carrier signal using the voltage dropping across the circuit-side inductance L1.

However, for the circuit 25 according to the invention or the method executable with the circuit 25, that represents no problem, since the extraction of the desired signal takes place using a current flowing through a current path of the circuit 25, which current corresponds to the carrier signal current flowing across the interface 3. Due to the load current additionally flowing across the load 15 upon connection of said load 15, this current also increases to a degree sufficient for the reliable extraction of the desired signal when the accompanying voltage drop of the voltage dropping across [the] circuit-side half of the interface 3 is too low for a desired signal extraction based upon the voltage drop.

In principle, the detection of the carrier signal current can take place via the demodulator 33 at any arbitrary current path of the circuit 25 through which a current corresponding to the carrier signal current flows. However, the current detection is preferably performed by means of a sub-circuit of the demodulator 33 inserted into one of the two series branches, connecting the two direct voltage source $U_{DC}$ to the DC-AC converter 27, 27', between the direct voltage source $U_{DC}$ and the switching device 29, 29' of the DC-AC converter 27, 27'.

That offers the advantage that the current corresponding to the carrier signal current here is present in rectified form, such that a rectifier, such as is necessary in demodulators known from the prior art, is not required here.

The sub-circuit may, for example, be a current measurement device 35, shown in FIG. 2 as a variant, that is used in a current path that is formed by the series branch leading from the interface 3 back to the direct voltage source $U_{DC}$.

Current measurement devices 35 naturally have a low impedance. The efficiency of the circuit 25 according to the invention is accordingly degraded only to a very small extent by the metrological detection of the carrier signal current. The current measured by means of the current measurement device 35 may then, for example, be supplied via a filter (not shown here) to a comparator (likewise not shown here), at whose output is then provided an information signal reflecting the desired signal.

In the circuit 25 according to the invention, a demodulator 33 is preferably used that uses circuit parts that are present anyway for demodulation of the carrier signal current in the circuit 25. An especially preferred embodiment consists in the sub-circuit of the demodulator 33 that is used in the current path being designed as a current detection circuit 37 shown in FIG. 2 as a further variant, via which a signal corresponding to the current flowing through the series branch is decoupled. In this instance, the current measurement device 35 is naturally omitted. Just like the aforementioned current measurement device 35, the current detection circuit 37 has a correspondingly low impedance with regard to the current detection to be performed via this.

The current detection circuit 37 is preferably designed such that, together with the switching device 29 of the DC-AC converter 27, it forms an envelope demodulator whose output signal dependent upon the carrier signal current is tapped via the current detection circuit 37. In the exemplary embodiment shown here, the current detection circuit 37 comprises a resistor RI inserted into the current path in the series branch and a capacitor CI connected in parallel to the resistor RI. In this current detection circuit 37, the output signal of the current detection circuit 37, which output signal corresponds here to the output signal of the envelope demodulator, is tapped in the form of the voltage dependent upon the carrier signal current, said voltage dropping across the capacitor CI.

Alternatively, however, current detection devices of different design may also be used that, together with the switching device 29, form an envelope demodulator whose output signal may be tapped via the current detection circuit.

An amplifier 39 that amplifies the output signal tapped via the current detection circuit 37 or amplifies the output signal of the envelope demodulator is downstream of the current detection circuit 37 used in the current path. Downstream of the amplifier 39 is a bandpass filter 41 that filters the amplified output signal and supplies it to a comparator 43 with adjustable comparator threshold, said comparator 43 being downstream of the bandpass filter 41. An information signal reflecting the extracted desired signal is then provided at the output of the comparator 43.

The output signal of the current detection circuit 37 or of the envelope demodulator may be amplified via the amplifier 39 connected in parallel to the current path, without the impedance of the circuit 25 that is active in relation to the transmission thereby being increased. That offers the advantage that a signal of sufficient magnitude is provided via the amplifier 39, even when the impedance of the current detection circuit 37 is extremely low, and/or the element 9 to be supplied temporarily consumes a great amount of power.

Due to the very low impedance of the current detection circuit 37 with regard to the current detection, distinctly less power loss is realized via the current detection circuit 37 than via the series circuit of resistor R and choke coil LD of Class E amplifiers used in the prior art. Accordingly, more power is provided via the circuit 25 according to the invention for supplying the electric load 5.

In applications in which a transmission of desired signals from the electric load 5 is not required over the long term, the efficiency of the circuit 25, and therefore also the power provided via this for supplying the electric load 5, may optionally be even further increased by the current detection circuit 37 being connected only when it is actually required. For this, the circuit 25 may, for example, be equipped with a bridge path 45 connected to the series branch in parallel with the current detection circuit 37, into which bridge path 45 is inserted a switch S5 that is activated by means of a control device 47 such that the bridge path 45 is interrupted during the reception of desired signals and bridges the current detection circuit 37 if no desired signals are transmitted. Analogously, the current measurement device 35 may naturally also be connected, as necessary, by means of a bridge path 45 of identical design (not shown here).

The information signal provided at the output of the comparator 43 may, for example, be used in a data processing device 49 that can be connected to the circuit 25. The connection of the data processing device 49 to the circuit 25 may, for example, take place via a circuit 51 connected at the output side to the comparator 43 and suitable for asynchronous serial data transmission for example, a universal asynchronous receiver/transmitter (UART) of a microcontroller or of an RS-485 driver.

In the circuit 25 according to the invention, no choke coil is required. That offers the advantage of a distinct savings in space and, moreover, enables the circuit 25 to be accommodated without any problem in a housing to be filled with potting compound.

Figure 4:
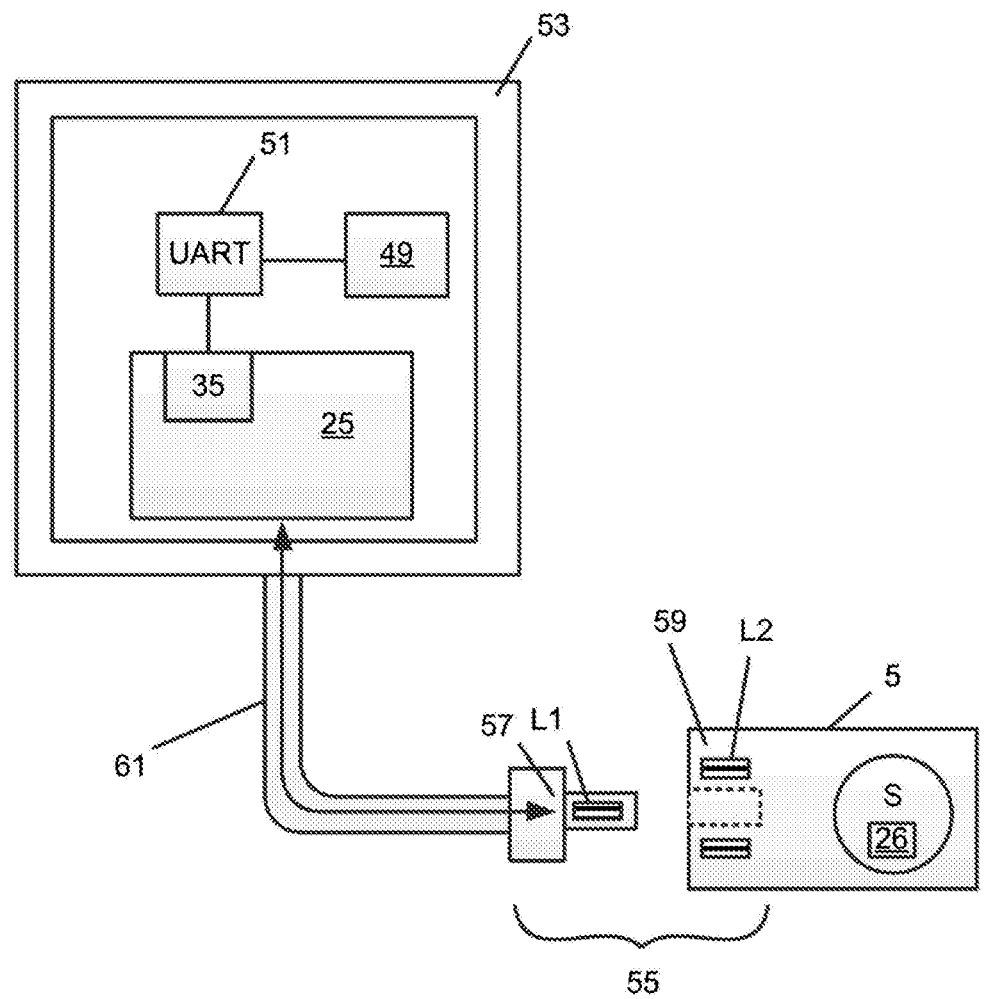
FIG. 4 shows a field device comprising the circuit from FIG. 2.

Circuits 25 according to the invention may be used in field devices, for example. For this, FIG. 4 shows an exemplary embodiment of a field device comprising the circuit 25 from FIG. 2. The field device comprises a superordinate unit 53, e.g., a transmitter, in which the circuit 25 is arranged, and the electric load 5 that can be connected to the circuit 25 via the interface 3. The field device is preferably of modular design, in that the superordinate unit 53 and the electric load 5 are connected to one another both electrically preferably, wirelessly and mechanically via a releasable plug connector 55. This allows the superordinate unit 53 or the electric load 5 to be exchanged as necessary.

To produce a wireless electrical connection, the plug connector 55 preferably comprises two components 57, 59 that can be mechanically connected to one another such as, for example, plug and socket in which is enclosed a respective half of the interface 3, e.g., one of the two inductances L1, L2. The inductances L1, L2 in the components 57, 59 are thereby respectively arranged such that they form an inductive transmitter if the components 57, 59 are connected to one another.

One of the components 57 is thereby connected either directly or as shown here via a cable 61 to the superordinate unit 53, and the other component 59 is connected either directly as shown here or via a cable to the electric load 5.

The invention claimed is:

1. A circuit for supplying power to an electric load that can be connected to the circuit via an interface, and for receiving desired signals that are transmitted from the electric load by an amplitude modulation, performed by the electric load, of a carrier signal transmitted from the circuit via the interface, said carrier signal serving to supply power to the electric load, comprising:
   a carrier signal generator including a direct voltage source and a DC-AC converter downstream of the direct voltage source; and
   a demodulator including a current detection circuit in a series branch of the circuit through which flows the current corresponding to the carrier signal current and via which an output signal corresponding to the carrier signal current can be tapped,
   wherein the demodulator is configured to extract desired signals modulated by the electric load on the carrier signal, wherein the demodulator is configured to extract the desired signals using a current corresponding to a carrier signal current flowing through a current path of the circuit during a transmission of the desired signals, said carrier signal current flowing across the interface.

2. The circuit according to claim 1, wherein the current detection circuit includes a current measurement device.

3. The circuit according to claim 1, wherein the current detection circuit is between the direct voltage source and the DC-AC converter in a series branch of the circuit that connects the direct voltage source to the DC-AC converter.

4. The circuit according to claim 1, the current detection circuit further including
   an amplifier connected in parallel to the current path and downstream of the current detection circuit,
   a bandpass filter disposed downstream of the amplifier, and
   a comparator having an adjustable comparator threshold, the comparator disposed downstream of the bandpass filter.

5. The circuit according to claim 1, wherein the DC-AC converter includes a resonator fed via a switching device, and wherein the current detection circuit and the switching device form an envelope demodulator.

6. The circuit of claim 5, wherein the switching device is designed as a full bridge.

7. The circuit of claim 5, wherein the switching device is designed as a half bridge.

8. The circuit of claim 5, wherein the DC-AC converter is configured and integrated into the circuit such that the circuit includes components increasing an impedance of the DC-AC converter, wherein the components are neither included in the DC-AC converter nor connected in series to the DC-AC converter.

9. The circuit according to claim 5, wherein the resonator is a resonant circuit operated via a timer of a switch of the switching device in a resonance range, said timer being matched to a resonance frequency of the resonator,
wherein the resonant circuit is an LLC resonant circuit; the resonant circuit includes exclusively at least one capacitor and at least one coil; and/or the resonant circuit includes at least one series resonant circuit and/or at least one parallel resonant circuit.

10. The circuit according to claim 1, further comprising:
a bridge path connected to the series branch in parallel with the current detection circuit; and
a switch in the bridge path and activated by a control device to interrupt the bridge path during the reception of the desired signals.

11. The circuit according to claim 1, wherein the current detection circuit includes a resistor in the series branch and a capacitor connected in parallel to the resistor, and
wherein the output signal of the current detection circuit is a voltage dropping across the capacitor, which voltage can be tapped via said capacitor.

12. The circuit according to claim 1, wherein the circuit is connected via an interface to an electric load that includes a circuit-side inductance connected to the circuit and an electric load-side inductance connected to the electric load forming a transmitter together with the circuit-side inductance, and
wherein downstream of the demodulator is a communication circuit suitable for asynchronous, serial data transmission, a universal asynchronous receiver/transmitter, a universal asynchronous receiver/transmitter of a microcontroller or of an RS-485 driver, a circuit connected to a data processing device, and/or the electric load is a load modulator having a load that can be connected in parallel to an element of the electric load that is to be supplied with power, said parallel connection being via a switch controllable using the desired signals to be transmitted.

13. A method for supplying power to an electric load and for receiving desired signals from the electric load, comprising:
connecting a circuit with the electric load via an interface;
generating a carrier signal with the circuit using a direct voltage source and a DC-AC converter downstream of the direct voltage source, wherein the DC-AC converter is formed by a resonator fed via a switching device, wherein the DC-AC converter is designed and integrated into the circuit such that the circuit has components increasing the converter impedance, said components being neither contained in the DC-AC converter nor connected in series to the DC-AC converter;
supplying the carrier signal via the interface to the electric load, thereby supplying power to the electric load;
transmitting the desired signals from the electric load via the interface to the circuit, wherein the electric load modulates the desired signals onto the carrier signal using an amplitude modulation by modulating the load on the carrier signal;
detecting a current by a current detection circuit inserted into a series branch of the circuit between the direct voltage source and the DC-AC converter through which a current corresponding to a carrier signal current flows; and
extracting the desired signals from the carrier signal using the current that corresponds to the carrier signal current flowing across the interface during the transmission of the desired signals.

14. The method of claim 13, wherein the interface is an inductive interface formed by a coupling of a first inductor connected to the circuit with a second inductor connected to the load, and wherein the coupling enables a wireless transfer of the power and of the desired signals.

15. A field device comprising:
a circuit for supplying power to an electric load that can be connected to the circuit via an interface, and for receiving desired signals that are transmitted from the electric load by an amplitude modulation, performed by the electric load, of a carrier signal transmitted from the circuit via the interface, said carrier signal serving to supply power to the electric load, the circuit including:
a carrier signal generator including a direct voltage source and a DC-AC converter downstream of the direct voltage source, and
a demodulator including a current detection circuit in a series branch of the circuit through which flows the current corresponding to the carrier signal current and via which an output signal corresponding to the carrier signal current can be tapped,
wherein the demodulator is configured to extract desired signals modulated by the electric load on the carrier signal, wherein the demodulator is configured to extract the desired signals using a current corresponding to a carrier signal current flowing through a current path of the circuit during a transmission of the desired signals, said carrier signal current flowing across the interface;
a superordinate unit including the circuit;
a transmitter; and
an electric load that can be connected to the superordinate unit, wherein the electric load includes a sensor supplied with power by the superordinate unit and wherein the electric load includes a load modulator by which the electric load transmits desired signals to the circuit via amplitude modulation of a carrier signal transmitted from the circuit via the interface during operation.

16. The field device according to claim 15, wherein the interface includes a plug connector via which the superordinate unit can be connected to the electric load,
wherein the plug connector includes a first component and a second component, the first component and the second component embodied to mechanically releasably connect to each other,
wherein a first inductance connected to the superordinate unit is disposed in the first component, and a second inductance connected to the electric load is disposed in the second component, and
wherein when the two components are mechanically connected, the first inductance and the second inductance form an inductive transmitter.

* * * * *